United States Patent [19]

Levine

[11] 4,407,320

[45] Oct. 4, 1983

[54] LARGE AREA, FAULT TOLERANT SOLAR ENERGY CONVERTER

[75] Inventor: Jules D. Levine, Dallas, Tex.

[73] Assignee: Texas Instruments Incorporated, Dallas, Tex.

[21] Appl. No.: 299,695

[22] Filed: Sep. 8, 1981

[51] Int. Cl.³ .................. H01L 31/04; H01L 31/18
[52] U.S. Cl. .................................. 136/250; 29/572
[58] Field of Search ........................ 29/572; 136/250

[56] References Cited

U.S. PATENT DOCUMENTS 3,025,335  3/1962  Ralph ................................ 136/250
3,998,659 12/1976  Wakefield ......................... 136/250

*Primary Examiner*—Aaron Weisstuch
*Attorney, Agent, or Firm*—Melvin Sharp; James T. Comform; R. C. Mayes

[57] ABSTRACT

Semiconductor spheres are arranged within a plastic sheet, and laminated between two metal foil layers to make electrical contacts. A portion of each sphere is exposed on one side to allow light entry. The back ohmic contact has a spreading resistance which protects large array configurations from short circuits. Series interconnections of cells, for higher voltage, can be made in the same processing sequence, and are coplanar with the array. All manufacturing steps are completed at temperatures less than 400° C.

23 Claims, 9 Drawing Figures

LARGE AREA, FAULT TOLERANT SOLAR ENERGY CONVERTER

CROSS REFERENCE TO RELATED APPLICATION

Cross reference is made to the following: "A Method and Device for Providing an Ohmic Contact of High Resistance on a Semiconductor at Low Temperatures," U.S. patent application Ser. No. 299,694 (TI-8912), filed Sept. 3, 1981.

BACKGROUND OF THE INVENTION

The increased awareness of the limitations of our fossil fuel resources together with the need to develop renewable and efficient energy supplies has caused a considerable amount of research to be conducted into solar energy.

A significant problem with the development of photoelectric converters has been the cost of the semiconductor converter material. This material, commonly silicon, utilizes a P-N junction to develop a potential when exposed to light. However, to operate properly, a typical system requires a large amount of semiconductor material for a relatively small area. Another problem encountered is that either the thickness of the semiconductor material must be such that it will be tolerant of bending stresses, or the cells must be in such small units that they can be made flexible to the extent necessary for normal handling and use. A third problem area has been the fault tolerance of large area arrays, in that a single shorted cell may affect the entire unit by diverting the generated electricity through the shorted cell.

One approach to these problems was suggested in an article by M. B. Prince, entitled "Large Area Silicon Solar Cells" (14th Annual Power Source Conference, 1960, p. 26). He suggested using semiconductor spheres in a plastic matrix, but problems were encountered in making electrical contacts. For example, see the monograph "*Semiconductors and Semimetals - Vol.* 11, Solar Cells" by Harold Hovel, (Academic Press, 1975), chapter 9, section G on page 209.

Accordingly, it is an object of the present invention to provide a large area photoelectric converter array utilizing a minimum of semiconductor material.

It is another object of the invention to provide a flexible array for photoelectric conversion which is capable of bending and flexing without damage and which can be manufactured as a thin sheet.

It is a further object of the present invention to develop a large area photoelectric array with a sufficient short circuit fault tolerance that a number of short circuited cells do not cause significant degradation in electrical performance.

It is a further object of the invention to develop a low cost manufacturing process for a large area photoelectric array, in which the highest temperature required is less than 400° C.

An additional object is to provide a series interconnection system in the same plane as the array, connected during the array manufacturing process with very little additional cost to the finished assembly.

SUMMARY AND BRIEF DESCRIPTION OF THE INVENTION

In accordance with the present invention, a radiant energy converter system is provided comprising a matrix support member having a metallic foil. The metallic foil has first and second layers of polymeric material disposed on opposite sides of the foil and a plurality of cavities at spaced locations in the support member and extending at least through the foil, a substantially spherical semiconductor cell disposed in each cavity, each cell having a P-type region and an N-type region, the N-type region contacting the metallic foil within the respective cavity, and conductive means disposed along one side of the support member for contacting the P-type region of each cell. Each contact to the P-type region comprises a predetermined resistive element.

Furthermore, a plurality of the matrix support sphere assemblies as above may be interconnected in series such that the series interconnections are coplanar with and not substantially greater in thickness than the assemblies.

A method of making said radiant energy converter comprises the steps of doping the surface of a plurality of semiconductor spheres of P-type material with an N-type dopant, providing a metallic foil between two layers of polymeric material and providing holes in the foil for mounting these spheres, placing the spheres into the holes wherein a metallic foil makes electrical contact to the N-type surface region of each sphere, forming a seal around the spheres, selectively removing a first side of the sphere foil assembly to expose the subsurface P-type regions, and making an ohmic contact with a predetermined resistivity to each of the P-type regions. In a further embodiment, one of the two layers of polymeric material can be removed subsequent to the step of making ohmic contact to each of said p-type regions.

Furthermore, the above method may further comprise the step of adding another layer of plastic material to the sphere foil assembly to increase the matrix support thickness to approximately the average diameter of the spheres.

Each of the steps in the above method is performed at a temperature less than 400° C.

Furthermore, the sphere-foil assemblies can be interconnected electrically in series wherein the maximum thickness of the series interconnections is not substantially greater than the average diameter of the spheres.

FIG. 1 is a perspective view of a portion of the solar energy converter.

FIG. 2 shows a series of process steps wherein FIG. 2a is a cross-section of the foil-plastic laminate. FIG. 2b is a cross-section of the foil-plastic laminate shown after being perforated. FIG. 2c is a cross-section of the foil-plastic laminate after insertion of the doped sphere.

FIG. 3 shows additional steps in the processing.

DETAILED DESCRIPTION OF THE DRAWINGS

Figure 1:
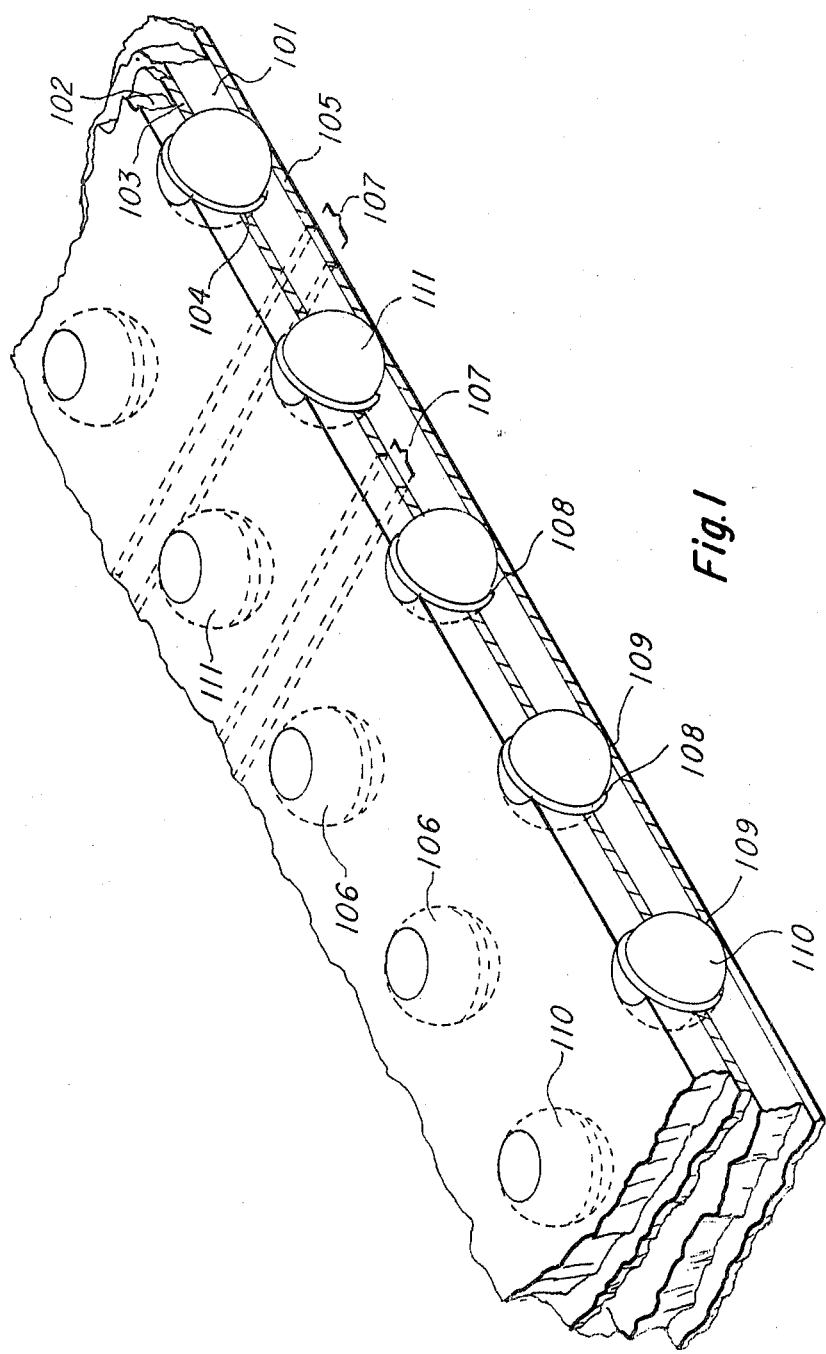

Referring now to FIG. 1, a perspective view of a portion of the completed converter array is shown wherein several silicon spheres 110 are shown mounted in the completed assembly. Metallic foil 103 makes electrical contact to the spheres on the N-type surface region shown at 104. Metallic foil 105 makes electric contact to the P-type regions shown at 109. The top portions 106 of spheres 110 are shown exposed in the upper half of the matrix assembly with a small portion of the sphere exposed to the air. Plastic layer 102 is formed of polyester material and is transparent to incident light. Plastic layer 101 is also comprised of a polyester material and provides electrical insulation as well as matrix support. Discontinuities in metallic foil 105 and metallic foil 103 are shown at 107. This allows a series interconnection by providing spheres 111 which are totally conductive and thus provide a coplanar electrical interconnection between subassemblies of the matrix.

In an alternative embodiment, series 111 are replaced by a metallic wire which is mounted in lieu of these spheres and which provides electrical interconnection between the top foil 103 and the bottom foil 105.

Figure 2A:
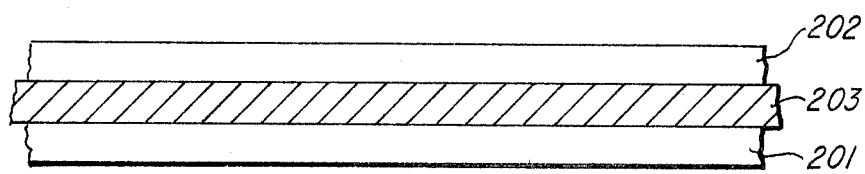
Figure 2B:
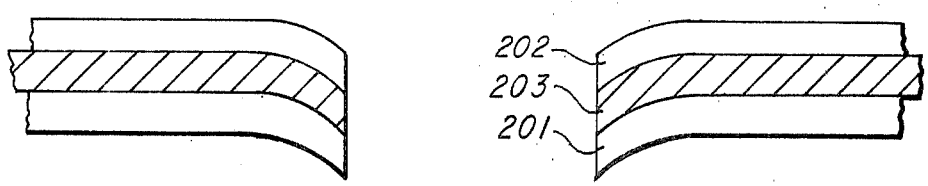
Figure 2C:
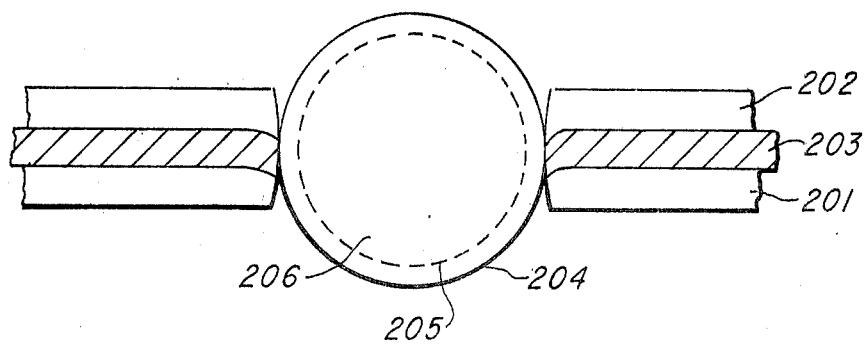

Referring now to FIG. 2, FIG. 2a is a cross-section of a polymer-foil laminate. 203 is a two mil thick aluminum which is laminated between two polyester sheets 202 and 201, each of which is approximately two mils thick. FIG. 2b shows results of a perforation step and FIG. 2c shows semiconductor sphere 204 mounted in the perforation. Prior to insertion, sphere 204 is composed of essentially P-type material 206 and has an N-type dopant diffused over the surface at 205. When sphere 204 is inserted into the perforation, electrical contact between the N-type surface region 205 and the aluminum foil 203 is made. The sphere is centered by use of a pressure step wherein the sphere-foil polymer assembly is pressed between two relatively soft surfaces such that the sphere is positioned approximately in the center of the perforated laminate.

Figure 3A:
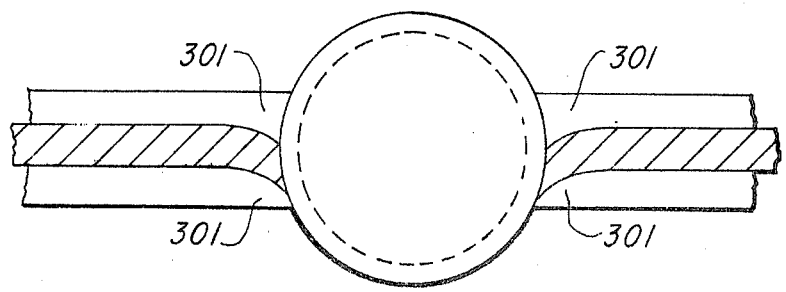
FIG. 3a is a cross-sectional view of the foil-plastic laminate and sphere after sealing of the plastic around the sphere.

Referring now to FIG. 3, FIG. 3a shows the result of a second pressure step wherein the plastic material forms a seal around the sphere at 301. This is accomplished at a pressure of approximately 0.1 pounds per sphere and a temperature of approximately 250° C. Thus, the polyester material forms a seal at 301 and firmly adheres to the sphere.

Figure 3B:
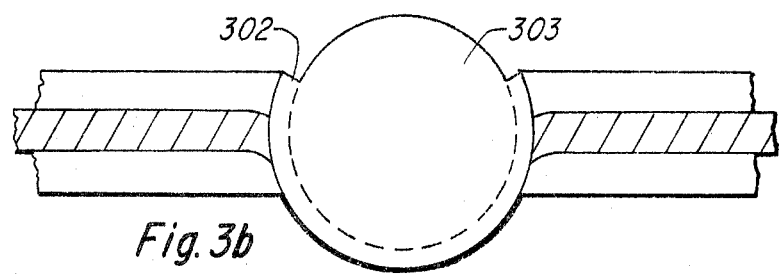
FIG. 3b is a cross-sectional view of the foil-plastic laminate after the sphere has been sealed and has had a portion of the N-type surface material removed.

FIG. 3b is a cross-sectional view of the sphere subsequent to the etch step in which the firmly mounted sphere is exposed on one side of the matrix to a N-type preferential etch. This results in removal of the surface material from the sphere, leaving the N-type surface material 205 in contact with the metallic foil and exposes the P-type region 206 to further processing steps.

Figure 4A:
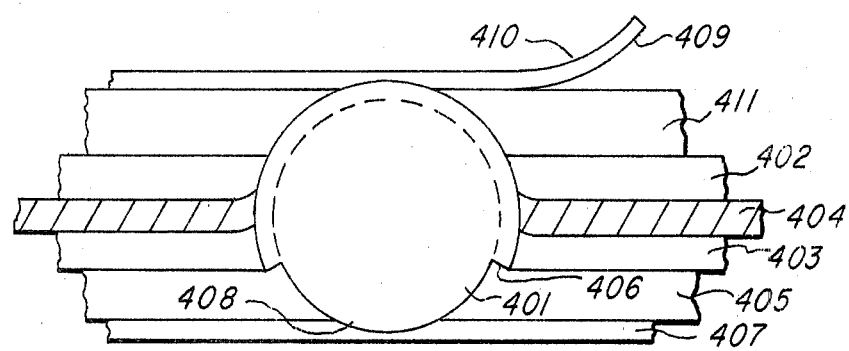
FIG. 4a is a cross-sectional view of the complete assembly prior to applying the second metallic foil and the final heat and pressure step.

Referring now to FIG. 4, in FIG. 4a the assembly has been inverted to position the exposed P-type region in contact with the back contact foil 407. Additional polyester material 405 is positioned to provide electrical insulation to the N-type surface region 205. Electrical contact to the P-type region 206 is made at 408 by applying pressure to the entire matrix. An additional polyester sheet 411 is applied to the front side of the cell and a surface pressure sheet 410 such as stainless steel foil with Teflon coating 409 is provided to retain symmetry during the compression step. Teflon coating 409 is provided to prevent bonding to the N-type surface region of the spheres and to provide for ease of removal subsequent to the final pressure bond step.

Figure 4B:
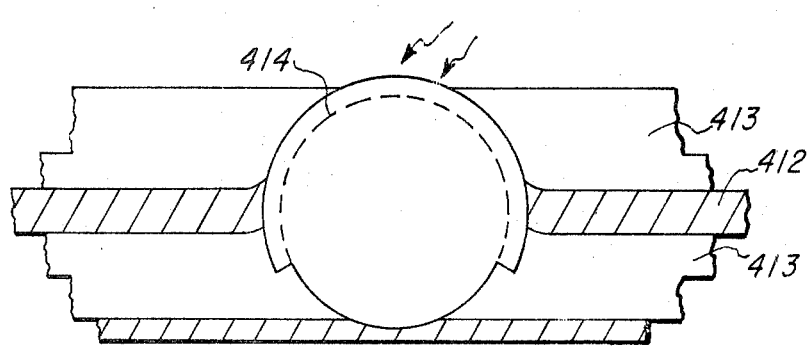
FIG. 4b is a cross-sectional view of a completed cell contacting two foils as it is mounted in the completed solar energy converter matrix.

In FIG. 4b, the completed cell assembly is shown subsequent to the final pressure bond step in which a pressure of approximately 5 pounds per sphere and a temperature of approximately 260° C. is sufficient to form electrical contact between the P-type region 206 and foil 407 and to combine the pairs of polyester sheets 201–411 and 202–405 in such a manner that they become essentially continuous matrix support lamina 413 and 415, respectively. Pressures of from 0.5 lb. per sphere to 10 lbs. per sphere are useful when 14 mil diameter spheres are bonded to 0.5 mil aluminum foil, as in the present example. However, sufficient pressure to significantly deform the metal is required to make a repeatable contact. If excessive pressure is applied, the silicon spheres will be crushed.

Light impinging upon the surface strikes junction 414 and causes an electrical potential to be developed between foils 203 and 407. Polyester sheets 413 and 415 are essentially transparent to light, and in addition to providing insulation of the N-type region from the P-type contact region, they also allow the upper foil 203 to act as a diffuse optical reflector and thereby improve the light reception of sphere 204. This is accomplished by positioning the matte side of the foil facing toward the light source.

By exposing the entire upper hemisphere of the semiconductor cell and by close pack arrangement of the spheres, the effective P-N junction area exposed to the light is greater than the planar surface area of the array.

Interconnection of adjacent matrix assemblies is easily made by the use of foil discontinuities shown in FIG. 1 at 107, and the use of entirely conductive spheres 111 which are entirely diffused N-type cells which act as short circuits between contacting foils. Additionally, any shorting sphere such as aluminum or nickel balls may be used, or a length of wire of the same approximate diameter as the spheres may be used to provide the shorting contact between the foils.

Figure 5:
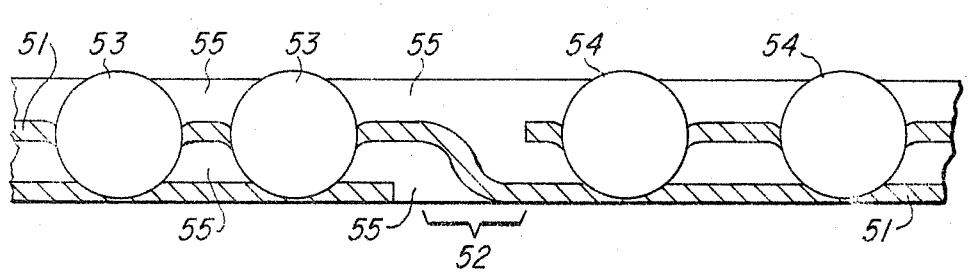
FIG. 5 shows an alternative embodiment of the present invention showing an alternative method of interconnection of adjacent matrix assemblies.

Referring to FIG. 5, a method of making series electrical interconnection of adjacent assemblies is shown. The foil 51 is shown contacting the N-type regions of spheres 53 are also contacting the P-type regions of spheres 54. The series connection is shown at 52. The polyester insulation and support material 55 is essentially continuous around the series interconnection.

Foil, as used in this document, means a metallic sheet having a thickness of 6 mils or less and a distinct malleable characteristic. The foils used in the present embodiment are common aluminum foils normally obtainable in rolls and are used in a variety of cooking and wrapping applications, normally 0.5 to 2 mils in thickness. Aluminum alloys are also useful.

The invention has been described and illustrated with respect to specific embodiments and it is understood that changes or modifications can be made without departing from the spirit and scope of the invention described herein.

What is claimed is:

1. A method of making a radiant energy converter comprising the steps of:
   a. doping the surface of a plurality of semiconductor spheres of P-type material with an N-type dopant;
   b. providing an aluminum foil between two layers of polymeric material and providing holes in said foil for mounting said spheres;

c. placing said spheres into said holes, whereby said aluminum foil makes electrical contact to the N-type surface region of each sphere to form a sphere-foil assembly;

d. forming a seal around said spheres;

e. selectively removing portions of a first side of the sphere-foil assembly to expose the subsurface P-type regions of said spheres; and f. making ohmic contact having a predetermined resistivity to each of said P-type regions.

2. A method as in claim 1, further comprising the step of adding another layer of plastic material to said sphere-foil assembly to increase the matrix support thickness to approximately the average diameter of the spheres.

3. A method as in claim 1, wherein each of said steps is performed at a temperature less than 400° C.

4. A method as in claim 1, further comprising the step of forming series electrical interconnections between a plurality of said sphere-foil assemblies wherein the maximum thickness of said series interconnections is not substantially greater than the average diameter of the spheres.

5. A method as in claim 4, wherein said series interconnections are formed by connecting said aluminum foil contacting the N-type regions of a first sphere-foil assembly to means for making ohmic contact to each of said P-type regions of a second sphere-foil assembly, said first and second sphere-foil assemblies having a substantially planar and adjacent relationship.

6. A method as in claim 4, wherein said series interconnections are comprised of aluminum foil sheets, each sheet providing contact to N-type regions of said first sphere-foil assembly and contact to P-type regions of said second sphere-foil assembly.

7. A method as in claim 1, further comprising the step of removing one of said two layers of polymeric material subsequent to making ohmic contact to each of said P-type regions.

8. The method of claim 1, wherein said step of placing said spheres into said holes comprises:
inserting said spheres into said holes, and
pressing said foil and said spheres between two relatively soft surfaces.

9. The method of claim 1, wherein said step of making ohmic contact comprises:
providing a second aluminum foil, and
pressing said subsurface p-type regions against said second foil with sufficient pressure to deform the metal of said second foil.

10. A radiant energy converter system comprising:
a. a plurality of substantially spherical semiconductor cells of a first conductivity type having a surface layer doping of a second conductivity type over a portion of the surface of each cell;
b. aluminum foil bonded to each of said cells in like conductivity regions;
c. conductive means making electrical contact to each cell in regions of opposite conductivity from those contacting said aluminum foil; and
d. insulating means for electrically separating said conductive means from said aluminum foil.

11. A radiant energy converter system comprising:
a. a matrix support member comprising an aluminum foil laminated to at least one layer of polymeric material, and having a plurality of cavities at spaced locations in the support member, said cavities extending at least through the foil;
b. a substantially spherical semiconductor cell disposed in each cavity, each cell having a p-type region and an n-type region, the n-type region contacting said aluminum foil in the respective cavity to form a matrix support-sphere assembly; and
c. conductive means disposed along one side of the support member for contacting the p-type region of each cell, each contact to the p-type region being of a predetermined resistivity, said conductive means insulated from said aluminum foil by said at least one layer of polymeric material.

12. A radiant energy converter system as in claim 9, wherein said matrix support member comprises aluminum foil and a first and second layer of polymeric material laminated to opposite sides of the foil.

13. A radiant energy converter system comprising multiple matrix assemblies, wherein each matrix assembly comprises:
a. a plurality of substantially spherical semiconductor cells of a first conductivity-type having a surface layer doping of a second conductivity-type over a portion of the surface of each cell;
b. aluminum foil bonded to each of said cells in like conductivity regions;
c. conductive means making electrical contact to each cell in regions of opposite conductivity from those contacting said aluminum foil; and
d. insulating means for electrically separating said conductive means from said aluminum foil;
wherein said aluminum foils of adjacent matrix assemblies are separated by foil discontinuities therebetween;
and further comprising means for electrically connecting adjacent matrix assemblies including means for connecting said aluminum foil of at least one of said matrix assemblies to said conductive means of an adjacent one of said matrix assemblies;
whereby said matrix assemblies are connected in series.

14. The system of claim 13, wherein respective said conductive means of adjacent matrix assemblies are also separated by foil discontinuities.

15. The system of claim 13, wherein said means for electrically connecting adjacent matrix assemblies comprises a plurality of entirely conductive objects, said entirely conductive objects being electrically connected to said aluminum foil of a first one of said matrix assemblies and to said conductive means of a second one of said matrix assemblies;
said conductive objects having approximately the diameter of said substantially spherical semiconductor cells.

16. The system of claim 15, wherein said conductive objects comprise uniformly doped silicon spheres.

17. A radiant energy converter system comprising a plurality of matrix assemblies, each said matrix assembly comprising:
a. a matrix support member comprising an aluminum foil laminated to at least one layer of polymeric material, and having a plurality of cavities at spaced locations in the support member, said cavities extending at least through the foil;
b. a substantially spherical semiconductor cell exposed in each cavity, each cell having a p-type region and an n-type region, the n-type region contacting said aluminum foil in the respective cavity to form a matrix support-sphere assembly; and c. conductive means disposed along one side of the support member for contacting the p-type region of each cell, each contact to the p-type region being of a predetermined resistivity, said conductive means being insulated from said aluminum foil by said layer of polymeric material;

wherein said aluminum foils of adjacent matrix assemblies are separated by foil discontinuities therebetween;

and further comprising means for electrically connecting said adjacent matrix assemblies including means for connecting said aluminum foil of at least one of said matrix assemblies to said conductive means of an adjacent one of said matrix assemblies; whereby said matrix assemblies are connected in series.

18. The system of claim 17, wherein respective said conductive means of adjacent matrix assemblies are also separated by foil discontinuities.

19. The system of claim 17, wherein said means for making contact between adjacent matrix assemblies comprises a plurality of entirely conductive objects, said entirely conductive objects being electrically connected to said aluminum foil of a first one of said matrix assemblies and to said conductive means of a second one of said matrix assemblies; said conductive objects having the approximate diameter as said substantially spherical semiconductor cells.

20. The system of claim 17, wherein said conductive objects comprise uniformly doped silicon spheres.

21. A method of making a radiant energy converter comprising the steps of:

a. doping the surface of a plurality of semiconductor spheres of p-type material with an n-type dopant;

b. providing a metallic foil having holes therein for mounting said spheres;

c. placing said spheres into said holes, whereby said aluminum foil makes electrical contact to the n-type surface regions of each sphere to form a sphere-foil assembly;

d. forming a seal around said spheres;

e. selectively removing portions of a first side of the sphere-foil assembly to expose the subsurface p-type regions; and f. making ohmic contacts having a predetermined resistivity to each of said p-type regions.

22. The method of claim 21, wherein said step of placing said spheres into said holes comprises:
inserting said spheres into said holes, and
pressing said foil and said spheres between two relatively soft surfaces.

23. The method of claim 21, wherein said step of making ohmic contact comprises:
providing a second aluminum foil, and
pressing said subsurface p-type regions against said second foil with sufficient pressure to deform the metal of said second foil.

* * * * *